(12) United States Patent
Wu

(10) Patent No.: US 6,180,988 B1
(45) Date of Patent: *Jan. 30, 2001

(54) SELF-ALIGNED SILICIDED MOSFETS WITH A GRADED S/D JUNCTION AND GATE-SIDE AIR-GAP STRUCTURE

(75) Inventor: Shye-Lin Wu, Hsinchu (TW)

(73) Assignee: Texas Instruments-Acer Incorporated, Hsinchu (TW)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/984,871

(22) Filed: Dec. 4, 1997

(51) Int. Cl.[7] .................................................. H01L 29/76

(52) U.S. Cl. ........................ 257/410; 257/346; 257/401; 257/900; 438/303; 438/306

(58) Field of Search ................................... 257/346, 382, 257/410, 401, 407, 900; 438/305, 306, 265, 303

(56) References Cited

U.S. PATENT DOCUMENTS

| 5,766,969 | * | 6/1998 | Fulford, Jr. et al. | 437/44 |
| 5,770,507 | * | 6/1998 | Chen et al. | 438/305 |
| 6,051,861 | * | 4/2000 | Togo | 257/340 |

OTHER PUBLICATIONS

Kyoji Yamashita et al., *Impact of the Reduction of the Gate to Drain Capacitance on Low Voltage Operated CMOS Devices,* 1995 Symposium on VLSI Technology Digest of Technical Papers, pp. 69–70.

M. Togo et al., *A Gate–side Air–gap Structure (GAS) to Reduce the Parasitic Capacitance in MOSFETs,* 1996 Symposium on VLSI Technology Digest of Technical Papers, pp. 38–39.

Ruth DeJule, *Meeting the Ultra–Shallow Junction Challenge,* Semiconductor International, Apr. 1997, pp. 50–56.

* cited by examiner

Primary Examiner—Mahshid Saadat
Assistant Examiner—George C. Eckert, II
(74) Attorney, Agent, or Firm—Harness, Dickey & Pierce, P.L.C.

(57) ABSTRACT

A MOSFET includes a gate oxide formed on a substrate. A thin dielectric layer is formed on the side walls of the gate. A gate is formed on the gate oxide. A first metal silicide layer is formed on top of the gate to increase the conductivity of the gate. Spacers are formed on the substrate and are separated with the gate by a space. Air gaps are formed between the gate and the spacers. First doped ion regions are formed aligned to the air gaps in the substrate, under a portion of the dielectric layer. Second doped ion regions are formed under the spacers in the substrate, next to the first doped ion regions. Third doped ion regions are formed in the substrate next to the second doped ion regions. The third doped ion regions have relatively highly doped ions to the first doped ion regions. The second doped ion regions are formed with immediately highly doped ions between the first and the third doped ion regions.

9 Claims, 3 Drawing Sheets

SELF-ALIGNED SILICIDED MOSFETS WITH A GRADED S/D JUNCTION AND GATE-SIDE AIR-GAP STRUCTURE

The present invention relates to a semiconductor device, and, more specifically, to a structure of fabricating a metal oxide semiconductor field effect transistor (MOSFET).

BACKGROUND OF THE INVENTION

With the advent of Ultra Large Scale Integrated (ULSI) technologies, the sizes of semiconductor devices have gotten smaller and smaller than ever, resulting in the packing density of a wafer being continuously increased.

Metal oxide semiconductor field effect transistors (MOSFETs) have been traditionally used and widely applied in semiconductor technologies. As with the trend of the integrated circuits, the fabrication of the MOSFET also meets various issues such as short channel effect. One of the issues is hot carriers that will inject into gate oxide, which is overcome by the development of lightly doped drain (LDD) structure. Parasitic capacitance is a main reason to degrade the speed of the MOSFET, which also causes high power for operating the devices. Typically, the reasons to generate the parasitic capacitance are the gate capacitance, gate-to-drain overlap capacitance, the junction capacitance and the gate fringing capacitance.

The requirement of the ULSI CMOS technology is the need for devices operated at low supply voltage and at a high speed. Thus, to minimizing the parasitic capacitance is a key way to achieve high speed and low power devices for CMOS ULSI devices". See "Impact of Reduction of Gate to Drain Capacitance on Low Voltage Operated CMOS Devices, Kyoji Yamashita et al., 1995, Symposium on VLSI Technology Digest of Technical Papers.". Prior art approaches to overcome these problems have resulted in the development of the gate-side air-gap (GAS) structure to reduce the parasitic capacitance in the MOSFET. Please see "A Gte-side Air-gap Structure (GAS) to Reduce the Parasitic Capacitance in MOSFETs38, M. Togo et al., 1996, Symposium on VLSI Technology Digest of Technical Papers. High speed and low power operation devices are achieved by using the GAS structure in MOSFETs. This effectively reduced the gate fringe capacitance of the MOSFETs. However, it is difficult to reduce the valve of fringing field capacitance ($C_{FR}$), due to the difficulty of scaling down the dielectric spacer thickness as scaling down the device dimension. The $C_{FR}$ becomes more important as the gate length is reduce to deep sub micron-meter range.

SUMMARY OF THE INVENTION

The method of the present invention includes forming a silicon dioxide layer on the substrate to serve as a gate oxide. A polysilicon layer is then deposited on the silicon dioxide layer. Next, lithography and etching steps are used to form a gate structure. Subsequently, a silicon oxynitride layer is formed on the substrate, and covering the gate structure. Silicon nitride side-wall spacers are formed on the side walls of the gate. An amorphous silicon layer is formed on the substrate, the side-wall spacers, and the top of the polysilicon gate. Then, the active regions (i.e., the source and the drain) are formed by using well-known ion implantation. The amorphous silicon layer acts as a buffer to prevent the substrate from damage during ion implantation.

A wet oxidation is subsequently carried out to convert the amorphous silicon into a doped oxide layer. Simultaneously, the ions in the original amorphous layer will diffuse into the substrate, thereby forming a lightly doped drain (LDD) adjacent to the drain. An etching process is then utilized to etch the oxide layer. Therefore, oxide side-wall spacers are formed on the silicon nitride side-wall spacers. Then, a metal silicide layer is formed on the top of the gate, and on the source and the drain. The silicon nitride side-wall spacers are removed and air gaps are formed between the gate and the side-wall spacers. Then, a low energy pocket ion implantation is performed to dope ions into the substrate via the air gaps. Next, an oxide is formed by chemical vapor deposition on the substrate, spacers and over the gate. Then, a rapid thermal process (RTP) is carried out for annealing.

The MOSFET includes a gate oxide formed on a substrate. A thin dielectric layer is formed on the side walls of the gate. A gate is formed on the gate oxide. A first metal silicide layer is formed on top of the gate to increase the conductivity of the gate. Spacers are formed on the substrate and are separated from the gate by a space. Air gaps are formed between the gate and the spacers. First doped ion regions are formed aligned to the air gaps in the substrate and under a portion of the dielectric layer. Second doped ion regions are formed under the spacers in the substrate and next to the first doped ion regions. Third doped ion regions are formed in the substrate next to the second doped ion regions. The third doped ion regions have relatively highly doped ions to the first doped ion regions. The second doped ion regions is formed with immediately highly doped ions between the first and the third doped ion regions. Preferably, the concentration of the first doped ion regions is about 5E17 to 5E20 atoms/cm$^3$. While the concentrations of the second and third doped ion regions are about 1E20 atoms/cm$^3$ and 1E20 to 5E21 atoms/cm$^3$, respectively.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
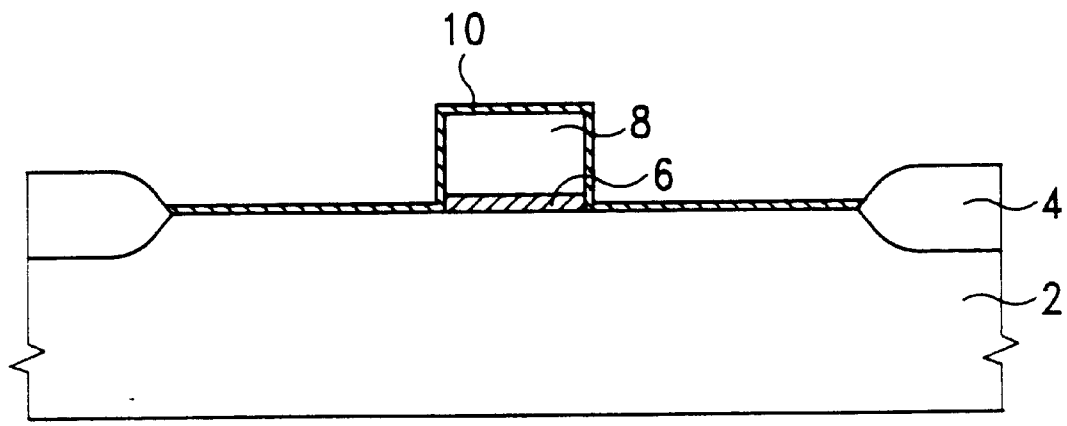
FIG. 1 is a cross section view of a semiconductor wafer illustrating the steps of forming a gate structure and forming a silicon oxynitride layer on a semiconductor substrate according to the present invention.

In a preferred embodiment, a single crystal silicon substrate 2 with a <100> crystallographic orientation is provided. Thick field oxide (FOX) regions 4 are formed to provide isolation between devices on the substrate. For example, the FOX regions 4 can be formed via lithography and etching steps to etch a silicon nitride-silicon dioxide composition layer. After the photoresist is removed and wet cleaned, thermal oxidation in a steam environment is used to grow the FOX regions 4 to a thickness of about 3000–8000 angstroms. The FOX regions 4 can be replaced by a plurality of shallow trench isolations, as is well known in the art.

Next, a silicon dioxide layer 6 is created on the top surface of the substrate 2 to serve as a gate oxide of a subsequently formed MOSFET. Typically, the silicon dioxide layer 6 is formed in an oxygen ambient at a temperature of about 800 to 1100 centigrade degrees. In this embodiment, the thickness of the silicon dioxide layer 6 is approximately 15–250 angstroms. Alternatively, the oxide layer 6 may be formed using any suitable oxide chemical compositions and procedure.

A polysilicon layer or amorphous silicon layer 8 is then deposited on the FOX regions 4 and the silicon dioxide layer 6 using a low pressure chemical vapor deposition process. In this embodiment, the thickness of the polysilicon layer 8 is about 300 to 2000 angstroms. Next, standard lithography and etching steps are used to etch the silicon oxide 4 and the polysilicon layer 8 for forming a gate structure consisting of the gate oxide 6 and the polysilicon 8. Subsequently, a silicon oxynitride layer 10 is formed on the substrate 2, and substantially conformally coveres the gate structure 6, 8. In such case, the silicon oxynitride layer 10 is formed by thermal oxidation in an $N_2O$ environment. The temperature for forming the silicon oxynitride layer 10 ranges from 700 to 1150° centigrade. As is well-known in the art, the etching to pattern the gate structure will cause substrate damage. Thus, the thermal oxidation used to form the silicon oxynitride layer 10 on the substrate 2 can recover the etching damage.

Figure 2:
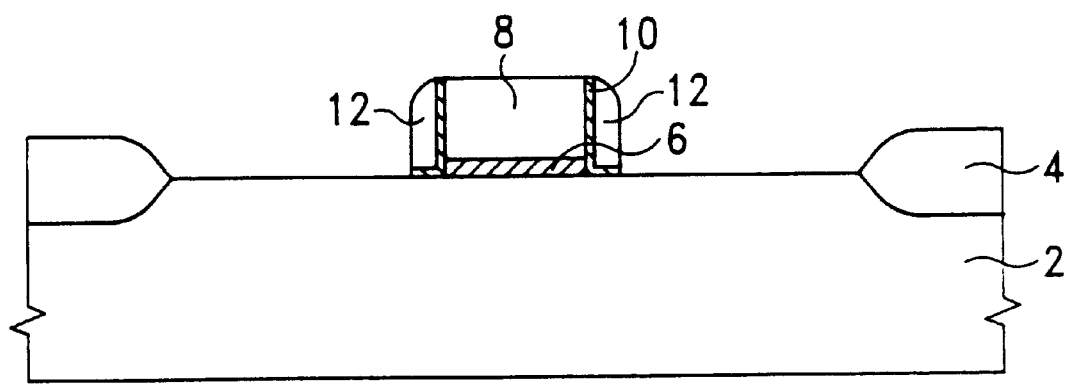
FIG. 2 is a cross section view of a semiconductor wafer illustrating the step of forming silicon nitride side-wall spacers according to the present invention.

Turning to FIG. 2, silicon nitride side-wall spacers 12 are formed on the side walls of the gate 8. In order to achieve this, an anisotropic etching is performed followed by the depositing of a silicon nitride layer 12 on the silicon oxynitride layer 10. The first portion of the silicon oxynitride layer 10 on the top of the polysilicon gate 8 is removed by etching, therefore, the top of the gate 8 is exposed. A second portion of the silicon oxynitride layer 10 remains between the gate polysilicon 8 and the side-wall spacers 12. Similarly, a third portion of the silicon oxynitride layer 10 laid under the side-wall spacers 12 are also remained on the substrate 2.

Figure 3:
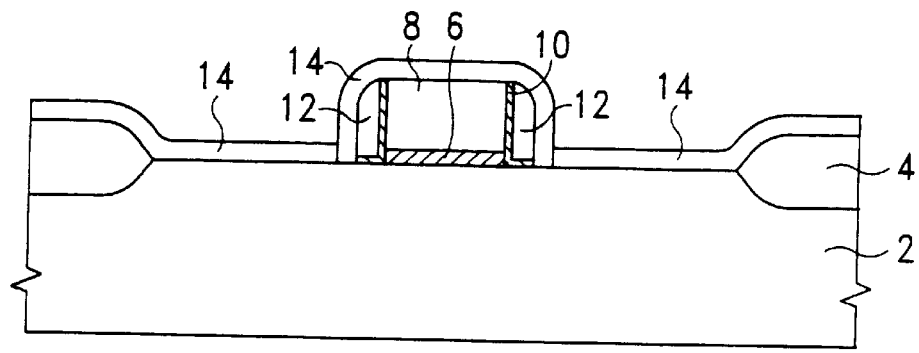
FIG. 3 is a cross section view of a semiconductor wafer illustrating the step of forming an amorphous silicon over the substrate according to the present invention.
Figure 4:
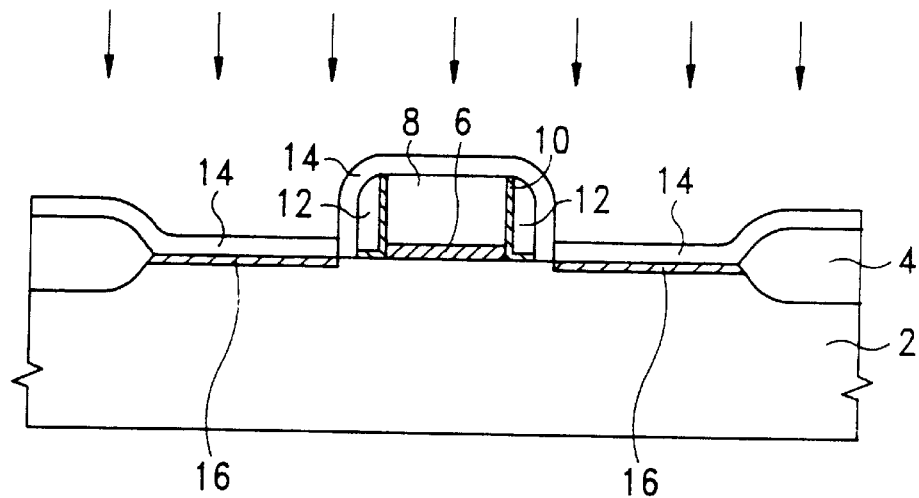
FIG. 4 is a cross section view of a semiconductor wafer illustrating the step of performing an ion implantation to form the source and drain according to the present invention.

Turning to FIG. 3, a thin amorphous silicon layer 14 is conformally formed on the substrate 2, the side-wall spacers 12, and the top of the polysilicon gate 8. The thickness of the amorphous silicon layer 14 is about 100 to 1000 angstroms. Active regions (i.e. the source and the drain) 16 are formed by using well-known ion implantation to implant appropriate impurities through the amorphous silicon layer 14 into those regions 16. The amorphous silicon layer 14 acts as a buffer to prevent the substrate 2 from damage during the ion implantation. The gate 8 is also implanted with the ions to increase its conductivity, is shown in FIG. 4. The dosage and the implantation energy of the step are respectively about 5E14 to 2E16 atoms/$cm^2$ and about 5 to 120 KeV.

Figure 5:
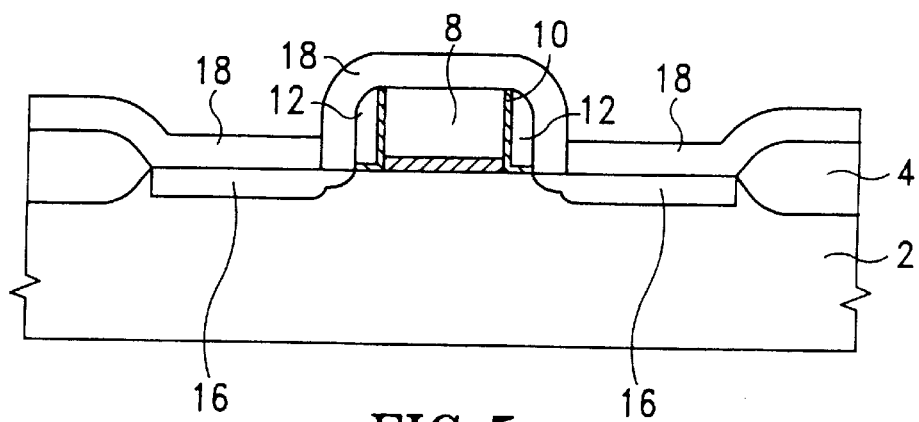
FIG. 5 is a cross section view of a semiconductor wafer illustrating the step of performing a wet oxidation according to the present invention.

Referring to FIG. 5, a wet oxidation is subsequently carried out to convert the amorphous silicon 14 into the doped oxide layer 18. Simultaneously, the ions in the original amorphous layer 14 will diffuse into the substrate 2, thereby forming a lightly doped drain (LDD) 19 adjacent to the drain 16. Further, the ions in the source/drain region 16 are driven more deep into the substrate 2 by the oxidation. The buffer layer is converted by wet oxidation at a temperature of about 700 to 1100 centigrade.

Figure 6:
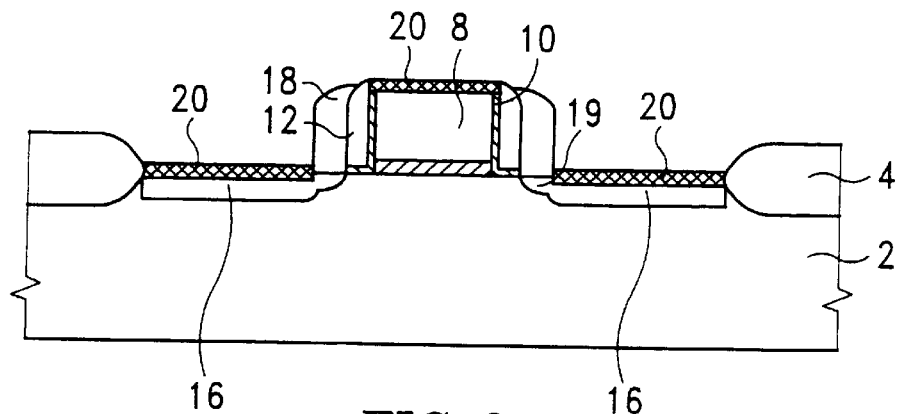
FIG. 6 is a cross section view of a semiconductor wafer illustrating the step of performing an etching to form oxide side-wall spacers according to the present invention.

Turning now to FIG. 6, an etching process is utilized to anisotropically etch the oxide layer 18. Oxide side-wall spacers 18 are formed on the side-wall spacers 12. Then, a metal silicide layer 20 is formed on the top of gate 8, and on the source and the drain 16. In this embodiment, a metal layer such as Ti, Pt, Co, W etc., is sputtered on the source and drain 16, on the gate 8, and on the side-wall spacers 18. Then, a thermal process is used to react the metal layer with the substrate 2 and the polysilicon gate 8. Then, the non-reaction portion of the metal layer is removed. Thus, a metal silicide layer 20 is self-aligned formed on the desired region, that is the source and drain 16, and the polysilicon gate 8.

Figure 7:
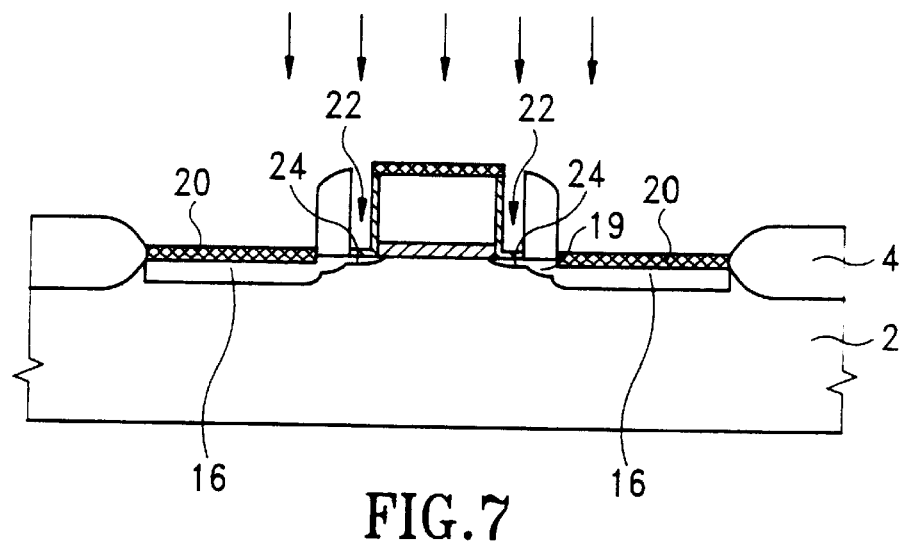
FIG. 7 is a cross section view of a semiconductor wafer illustrating the step of removing the silicon nitride side-wall spacers according to the present invention.

Turning next to FIG. 7, the silicon nitride side-wall spacers 12 are removed, and therefore air gaps 22 are formed between the gate 8 and the side-wall spacers 18. Preferably, the silicon nitride side-wall spacers 12 can be removed by hot $H_3PO_4$ solution. Then, a low energy pocket ion implantation is performed to dope ions into the substrate 2 via the air gaps 22. Extended source and drain 24 is generated in the substrate 2 and self-aligned to the gate-side air gaps (GAS) 22. The dosage of the implantation is about 5E13 to 1E15 atoms/$cm^2$. The implantation energy of the step is about 0.5 to 20 KeV. The GASs 22 are used to reduce the effect of the gate fringe capacitance ($C_{FR}$).

Figure 8:
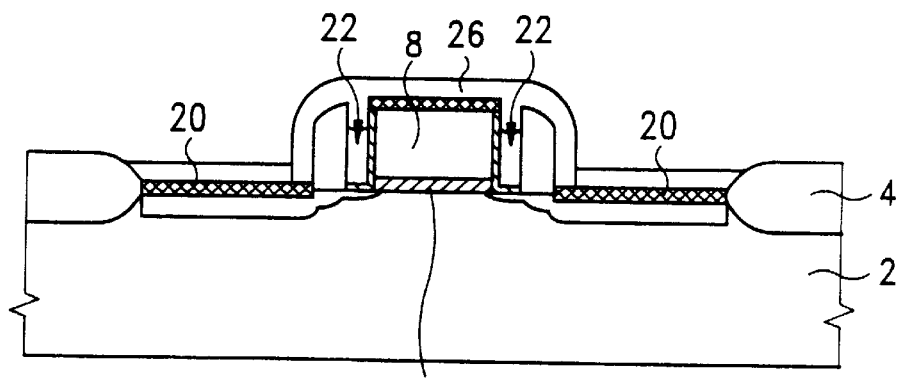
FIG. 8 is a cross section view of a semiconductor wafer illustrating the step of forming a dielectric layer on the gate and the substrate according to the present invention.

Next, as can be seen by reference to FIG. 8, an oxide 26 is formed by chemical vapor deposition on the substrate 2, spacers 18 and over the gate 8. Only a portion of the oxide 26 refilled in the GASs 22 and located at top of the gaps 22 due to the gaps 22 being too narrow. Then, a rapid thermal process (RTP) is carried out for annealing.

As shown in FIG. 8, the MOSFET includes a gate oxide 6 formed on the substrate 2. A thin dielectric layer 10, such as silicon oxynitride layer, is formed on the side walls of the gate 8. A gate 8 is formed on the gate oxide 6. A first metal silicide layer 20 is formed on top of the gate 8 to increase the conductivity of the gate 6. Spacers 18 are formed on the substrate and are separated from the gate 8 by a space. Air gaps 22 are formed between the gate 8 and the spacers 18. A portion of the dielectric layer 10 is also formed at the bottom of the air gaps 22. First doped ion regions 24 are formed aligned to the air gaps 22 in the substrate 2, under a portion of the dielectric layer 10. Second doped ion regions 19 are formed under the spacers 18 in the substrate 2, next to the first doped ion regions 24. Third doped ion regions 16 are formed in the substrate 2 next to the second doped ion regions 19. The third doped ion regions 16 have relatively highly doped ions to the first doped ion regions 24. The second doped ion regions 19 are formed with immediately highly doped ions between the first and the third doped ion regions 16, 24. The metal silicide layer is also formed on the third doped ion regions to increase the conductivity of the third doped ion regions. Preferably, the concentration of the first doped ion regions is about 5E17 to 5E20 atoms/$cm^3$. While the concentrations of the second and third doped ion regions are about 1E20 atoms/$cm^3$ and 1E20 to 5E21 atoms/$cm^3$, respectively.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A transistor with gate-side air gaps (GASs) formed on a semiconductor substrate, said transistor comprising:

a gate oxide formed on said substrate;

a gate formed on said gate oxide;

an oxynitride layer formed on the side walls of said gate;

spacers formed on said substrate and separated with said gate with a space, air gaps being formed between said gate and said spacers, a portion of said oxynitride layer being formed at a bottom of said air gaps, wherein said oxynitride layer is used to recover the etching damage generated by patterning of said gate;

first doped ion regions formed aligned to said air gaps in said substrate, and under said portion of said oxynitride layer;

second doped ion regions formed under said spacers in said substrate, and next to said first doped ion regions; and third doped ion regions formed in said substrate, and next to said second doped ion regions, said third doped ion regions having relatively highly doped ions to said first doped ion regions, said second doped ion regions having immediately highly doped ions between said first doped ion regions and said third doped ion regions.

2. The transistor of claim 1, further comprising:

a first metal silicide layer formed on top of said gate to increase the conductivity of said gate; and a second metal silicide layer formed on said third doped ion regions to increase the conductivity of said third doped ion regions.

3. The transistor method of claim 1, wherein said first doped ion regions have a concentration about 5E17 to 5E20 atoms/cm$^3$.

4. The transistor of claim 1, wherein said second doped ion regions have a concentration about 1E20 atoms/cm$^3$.

5. The transistor of claim 1, wherein said third doped ion regions have a concentration about 1E20 to 5E21 atoms/cm$^3$.

6. A transistor with gate-side air gaps (GASs) formed on a semiconductor substrate, said transistor comprising:

a gate oxide formed on said substrate;

a gate formed on said gate oxide;

an oxynitride layer formed on the side walls of said gate;

spacers formed on said substrate and separated with said gate with a space, air gaps being formed between said gate and said spacers, a portion of said [dielectric] oxynitride layer being formed at a bottom of said air gaps, wherein said oxynitride layer is used to recover the etching damage generated by patterning of said gate;

first doped ion regions formed aligned to said air gaps in said substrate, and under said portion of said oxynitride layer;

second doped ion regions formed under said spacers in said substrate, and next to said first doped ion regions;

third doped ion regions formed in said substrate, and next to said second doped ion regions, said third doped ion regions having relatively highly doped ions to said first doped ion regions, said second doped ion regions having immediately highly doped ions between said first doped ion regions and said third doped ion regions;

a first metal silicide layer formed on top of said gate to increase the conductivity of said gate; and a second metal suicide layer formed on said third doped ion regions to increase the conductivity of said third doped ion regions.

7. The transistor method of claim 6, wherein said first doped ion regions have a concentration about 5E17 to 5E20 atoms/cm$^3$.

8. The transistor of claim 6, wherein said second doped ion regions have a concentration about 1E20 atoms/cm$^3$.

9. The transistor of claim 6, wherein said third doped ion regions have a concentration about 1E20 to 5E21 atoms/cm$^3$.

* * * * *